(12) United States Patent
Seo

(10) Patent No.: US 12,265,126 B2
(45) Date of Patent: Apr. 1, 2025

(54) CONTACT MONITORING DEVICE FOR VACUUM CIRCUIT BREAKER AND VACUUM CIRCUIT BREAKER HAVING SAME

(71) Applicant: LS ELECTRIC CO., LTD., Anyang-si (KR)

(72) Inventor: Min-Kyu Seo, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 556 days.

(21) Appl. No.: 17/641,608

(22) PCT Filed: May 11, 2020

(86) PCT No.: PCT/KR2020/006166
§ 371 (c)(1),
(2) Date: Mar. 9, 2022

(87) PCT Pub. No.: WO2021/049733
PCT Pub. Date: Mar. 18, 2021

(65) Prior Publication Data
US 2022/0317188 A1 Oct. 6, 2022

(30) Foreign Application Priority Data

Sep. 10, 2019 (KR) .................. 10-2019-0112048
Sep. 10, 2019 (KR) .................. 10-2019-0112049

(51) Int. Cl.
*G01R 31/327* (2006.01)
*H01H 33/662* (2006.01)
(Continued)

(52) U.S. Cl.
CPC ......... *G01R 31/327* (2013.01); *H01H 33/662* (2013.01); *H01H 33/664* (2013.01); *H01H 33/666* (2013.01)

(58) Field of Classification Search
CPC ... H01H 33/666; H01H 33/668; H01H 33/662
See application file for complete search history.

(56) References Cited

U.S. PATENT DOCUMENTS 5,286,933 A * 2/1994 Pham .................. H01H 33/668
324/424
7,253,630 B1 * 8/2007 Zhou .................. G01R 31/3274
324/424
(Continued)

FOREIGN PATENT DOCUMENTS

CN         1073800 A     6/1993
CN      201130015 Y    10/2008
(Continued)

OTHER PUBLICATIONS

Notice of Allowance for related Chinese Application No. 202080062797. 1; action dated Mar. 29, 2024; (7 pages).
(Continued)

*Primary Examiner* — Jermele M Hollington
*Assistant Examiner* — Temilade S Rhodes-Vivour
(74) *Attorney, Agent, or Firm* — K&L Gates LLP

(57) ABSTRACT

The present disclosure provides a contact monitoring device for a vacuum circuit breaker. The contact monitoring device is provided in a vacuum circuit breaker comprising: a vacuum interrupter having a fixed electrode which is fixed in an insulating container and is provided with a fixed contact at one end, and a movable electrode which is installed in the insulating container to be able to be lifted or lowered wherein the vacuum interrupter is provided with a movable contact at one end, the movable contact contacting or being separated from the fixed contact when the movable electrode is lifted or lowered; and a push rod assembly which is coupled to the other end of the movable electrode and lifts or lowers the movable electrode. In addition, the present (Continued)

disclosure provides a vacuum circuit breaker having the contact monitoring device.

24 Claims, 13 Drawing Sheets

(51) Int. Cl.
*H01H 33/664* (2006.01)
*H01H 33/666* (2006.01)

(56) References Cited

U.S. PATENT DOCUMENTS

| | | | | |
|---|---|---|---|---|
| 8,861,144 B2 * | 10/2014 | Shea | ................ | H01T 2/02 |
| | | | | 361/13 |
| 9,329,238 B1 | 5/2016 | Carson et al. | | |
| 2015/0206621 A1 * | 7/2015 | Mahdizadeh | ............ | H01B 3/40 |
| | | | | 521/97 |
| 2016/0139206 A1 | 5/2016 | Carson et al. | | |
| 2017/0287659 A1 * | 10/2017 | Ryu | ..................... | H01H 33/662 |
| 2018/0254159 A1 | 9/2018 | Shi et al. | | |

FOREIGN PATENT DOCUMENTS

| | | |
|---|---|---|
| CN | 101573549 A | 11/2009 |
| CN | 103367066 A | 10/2013 |
| CN | 104241008 A | 12/2014 |
| CN | 104465202 A | 3/2015 |
| CN | 204718550 U | 10/2015 |
| CN | 105372785 A | 3/2016 |
| CN | 106783375 A | 5/2017 |
| CN | 106876218 A | 6/2017 |
| CN | 108917671 A | 11/2018 |
| CN | 208738126 U | 4/2019 |
| CN | 209045386 U | 6/2019 |
| JP | S53-006888 A | 1/1978 |
| JP | S58-195932 U | 12/1983 |
| JP | H0869733 A | 3/1996 |
| JP | 08241653 A * | 9/1996 |
| JP | H08241653 A | 9/1996 |
| JP | H09282981 A | 10/1997 |
| JP | H10321089 A | 12/1998 |
| JP | 2003297210 A | 10/2003 |
| JP | 2004356109 A | 12/2004 |
| JP | 2005071727 A | 3/2005 |
| JP | 2006310133 A | 11/2006 |
| JP | 2010162692 A | 7/2010 |
| JP | 2015528982 A | 10/2015 |
| KR | 101860348 B1 | 5/2018 |
| WO | 2012116824 A1 | 9/2012 |

OTHER PUBLICATIONS

Office Action for related Chinese Application No. 202080062797.1; action dated Mar. 29, 2024; (8 pages).
International Search Report for related International Application No. PCT/KR2020/006166; report dated Mar. 18, 2021; (5 pages).
Written Opinion for related International Application No. PCT/KR2020/006166; report dated Mar. 18, 2021; (4 pages).
Extended European Search Report for related European Application No. 20863761.1; action dated Feb. 10, 2023; (8 pages).
Notice of Allowance for related Japanese Application No. 2022-515688; action dated Mar. 22, 2023; (3 pages).

* cited by examiner

CONTACT MONITORING DEVICE FOR VACUUM CIRCUIT BREAKER AND VACUUM CIRCUIT BREAKER HAVING SAME

CROSS-REFERENCE TO RELATED APPLICATIONS

This application is the National Stage filing under 35 U.S.C. 371 of International Application No. PCT/KR2020/006166, filed on May 11, 2020, which claims the benefit of earlier filing date and right of priority to Korea utility model Application No. 10-2019-0112048 filed on Sep. 10, 2019, and Korea utility model Application No. 10-2019-0112049, filed on Sep. 10, 2019, the contents of which are all hereby incorporated by reference herein in their entirety.

FIELD

The present disclosure relates to a contact monitoring device for a vacuum circuit breaker capable of monitoring a wear amount of a contact inside a vacuum interrupter, and a vacuum circuit breaker having the same.

BACKGROUND

A vacuum circuit breaker is an electrical protector that uses dielectric strength of the vacuum to protect load devices and lines from fault currents in an event of short circuits or ground faults occurring in electrical circuits.

The vacuum circuit breaker performs power transport control and power system protection. The vacuum circuit breaker has a large breaking capacity and high reliability and safety. Because the vacuum circuit breaker may be mounted in a small installation space, the breaker may be easily applied to a voltage range from a medium voltage to high voltage.

The vacuum circuit breaker includes a vacuum interrupter that blocks current, a power transmission device that transmits power to the vacuum interrupter, and a push rod that performing vertical reciprocating motion under power from the power transmission device to insert or withdraw a contact in the vacuum interrupter. In an example, Korean patent No. 10-1860348 (issue date 2018.05.16) discloses a vacuum interrupter of a vacuum circuit breaker (Hereinafter, reference numerals cited in the description of the conventional vacuum interrupter are those applied only to the description of the prior art).

The conventional vacuum interrupter 100 includes an insulating container 190, a fixed electrode 110, a movable electrode 150, and an arcing shield 210. The fixed electrode 110 and the movable electrode 150 have a fixed contact 130 and a movable contact 170, respectively. According to vertical movement of the movable electrode 170, the movable contact 170 contacts or is removed from the fixed contact 130.

The fixed contact 130 and the movable contact 170 have wear as a current blocking operation is repeated. When a contact wear amount is above a certain amount, repair or replacement is necessary. When the repair or replacement of the contact is not carried out in an appropriate time, short-time performance, short-circuit performance, and conductance performance of the vacuum interrupter may deteriorate. Therefore, it is necessary to detect a correct wear state of the contact.

SUMMARY

A purpose of the present disclosure is to provide a contact monitoring device for a vacuum circuit breaker capable of monitoring a wear amount of a contact inside a vacuum interrupter, and a vacuum circuit breaker having the same.

Further, a purpose of the present disclosure is to provide a contact monitoring device for a vacuum circuit breaker capable of detecting a contact wear amount as a displacement in a vertical direction using a photosensor having a sensing direction as a horizontal direction, and a vacuum circuit breaker having the same.

Purposes of the present disclosure are not limited to the above-mentioned purpose. Other purposes and advantages of the present disclosure that are not mentioned above may be understood based on following descriptions, and will be more clearly understood with reference to embodiments of the present disclosure. Further, it will be readily apparent that the purposes and advantages of the present disclosure may be realized using means and combinations thereof indicated in the Claims.

To achieve the above purposes, the present disclosure provides a contact monitoring device for a vacuum circuit breaker.

The contact monitoring device is disposed in a vacuum circuit breaker, wherein the vacuum circuit breaker includes: a vacuum interrupter having: a fixed electrode fixed in an insulating container and having a fixed contact at one end thereof; and a movable electrode installed in the insulating container so as to be able to move up and down, wherein the movable electrode has a movable contact at one end thereof, wherein the movable contact comes into contact with or is separated from the fixed contact as the movable contact moves up and down; and a push rod assembly coupled to the other end of the movable electrode to move up and down the movable electrode.

The contact monitoring device includes: a discriminative member formed on an outer circumferential face of a rod housing of the push rod assembly, wherein the discriminative member is stepped relative to the outer circumferential face of the rod housing; and a sensor assembly installed adjacent to the discriminative member, wherein the sensor assembly is configured to detect presence or absence of a step between the outer circumferential face of the rod housing and an outer side face of the discriminative member.

In this regard, the discriminative member is attached to the outer circumferential face of the rod housing, wherein the discriminative member has a preset thickness, and includes a preset length and a preset width, wherein the length extends along an axis along which the movable electrode moves up and down.

The discriminative member is formed to protrude outwardly and is formed integrally with the rod housing, wherein the discriminative member has a preset thickness, and includes a preset length and a preset width, wherein the length extends along an axis along which the movable electrode moves up and down.

Alternatively, the discriminative member is embodied as a groove having a preset horizontal dimension from the outer circumferential face of the rod housing,
 wherein the groove has a preset length and a preset width,
  wherein the length extends along an axis along which the movable electrode moves up and down.

The length is set to correspond to a vertical displacement of the rod housing occurring in a state in which each of the movable and fixed contacts has a preset reference thickness while the movable and fixed contacts contact each other.

The sensor assembly includes a photosensor module configured to determine the presence or absence of the step, based on whether a difference between a distance value from the photosensor module to the outer side face of the discriminative member and a distance value from the photosensor module to the outer circumferential face of the rod housing is equal to or greater than a predefined amount.

The device further comprises: a sensor holder for receiving and supporting the photosensor module; and a sensor bracket for coupling the sensor holder to a housing for accommodating therein the vacuum interrupter.

The present disclosure provides a vacuum circuit breaker having a contact monitoring device.

The vacuum circuit breaker includes a vacuum interrupter having: a fixed electrode fixed in an insulating container and having a fixed contact at one end thereof; and a movable electrode installed in the insulating container so as to be able to move up and down, wherein the movable electrode has a movable contact at one end thereof, wherein the movable contact comes into contact with or is separated from the fixed contact as the movable contact moves up and down; a main circuit having a housing accommodating therein the vacuum interrupter; a push rod assembly coupled to the other end of the movable electrode to move up and down the movable electrode; and a discriminative member formed on an outer circumferential face of a cylindrical rod housing of the push rod assembly, the discriminative member being stepped relative to the outer circumferential face of the rod housing; and a sensor assembly installed adjacent to the discriminative member, wherein the sensor assembly is configured to determine absence or presence of the step, based on whether a difference between a distance value from the sensor assembly to the outer side face of the discriminative member and a distance value from the sensor assembly to the outer circumferential face of the rod housing is equal to or greater than a predefined amount.

In this regard, the discriminative member is attached to the outer circumferential face of the rod housing, wherein the discriminative member has a preset thickness, and includes a preset length and a preset width, wherein the length extends along an axis along which the movable electrode moves up and down.

Alternatively, the discriminative member is formed to protrude outwardly and is formed integrally with the rod housing, wherein the discriminative member has a preset thickness, and includes a preset length and a preset width, wherein the length extends along an axis along which the movable electrode moves up and down.

Alternatively, the discriminative member is embodied as a groove having a preset horizontal dimension from the outer circumferential face of the rod housing,
  wherein the groove has a preset length and a preset width,
    wherein the length extends along an axis along which the movable electrode moves up and down.

In this regard, the length is set to correspond to a vertical displacement of the rod housing occurring in a state in which each of the movable and fixed contacts has a preset reference thickness while the movable and fixed contacts contact each other.

The breaker further comprises: a sensor holder for receiving and supporting the photosensor module; and a sensor bracket for coupling the sensor holder to a housing for accommodating therein the vacuum interrupter.

The contact monitoring device for the vacuum circuit breaker according to the present disclosure may use the photosensor to monitor the wear amount of the contact in real time to determine an appropriate maintenance timing based on the wear amount.

Further, the contact monitoring device for the vacuum circuit breaker according to the present disclosure may determine the contact wear amount using the photosensor before the contact wear amount exceeds a limit value, thereby improving reliability and performance of the vacuum circuit breaker.

Further, the contact monitoring device for the vacuum circuit breaker according to the present disclosure may detect the contact wear amount having a displacement in a vertical direction using the photosensor having the sensing direction in a horizontal direction. Therefore, the device may accurately detect the contact wear amount to determine the appropriate maintenance timing based on the detected amount.

The above-described effects, and specific effects of the present disclosure as not mentioned above will be described based on specific details for carrying out the disclosure.

DETAILED DESCRIPTION

Figure 1:
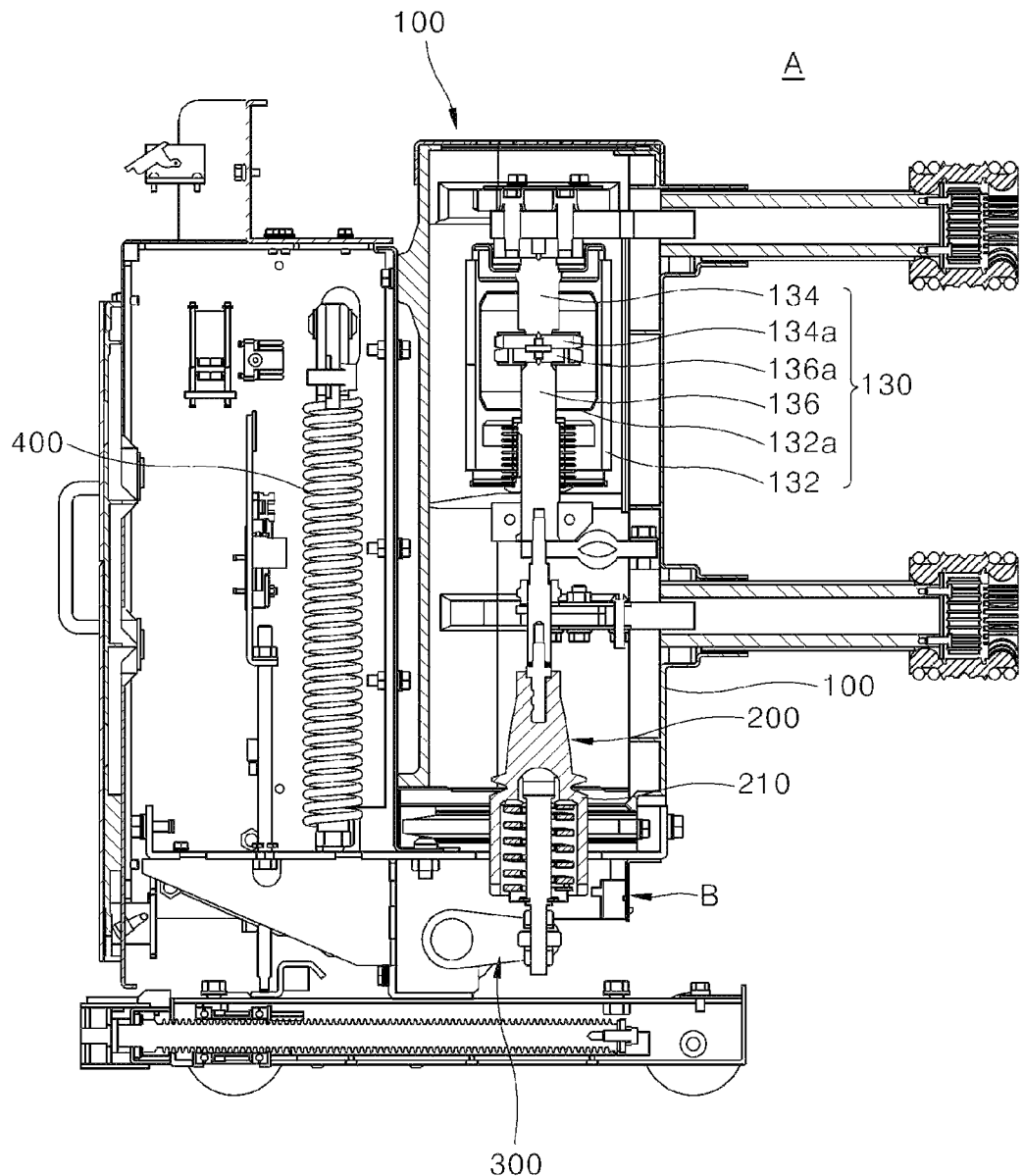
FIG. 1 is a partial cross-sectional view showing a vacuum circuit breaker with a contact monitoring device in accordance with the present disclosure.

The above objects, features and advantages will be described in detail later with reference to the accompanying drawings. Accordingly, a person with ordinary knowledge in the technical field to which the present disclosure belongs will be able to easily implement the technical idea of the present disclosure. In describing the present disclosure, when it is determined that a detailed description of a known component related to the present disclosure may unnecessarily obscure gist the present disclosure, the detailed description is omitted. Hereinafter, a preferred embodiment according to the present disclosure will be described in detail with reference to the accompanying drawings. In the drawings, the same reference numerals are used to indicate the same or similar elements.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

FIG. 1 is a partial cross-sectional view showing a vacuum circuit breaker to which a contact monitoring device according to the present disclosure is applied.

As shown in FIG. 1, a contact monitoring device B for a vacuum circuit breaker according to a first embodiment of the present disclosure is installed below a main circuit 100 of a vacuum circuit breaker A to monitor a contact wear of the vacuum interrupter 130.

Main components of the vacuum circuit breaker A are briefly described (hereinafter, only components of the vacuum circuit breaker necessary for the description of the present disclosure will be briefly described).

The vacuum circuit breaker A includes a main circuit 100 including a vacuum interrupter 130, a push rod assembly 200 and a main shaft 300 for transmitting power to a contact of the vacuum interrupter 130, and a mechanism assembly 400 that generates a driving force and is connected to the main shaft 300 to deliver the driving force thereto.

The main circuit 100 has a housing 110 and the vacuum interrupter 130 installed inside the housing 110. The vacuum interrupter 130 includes an insulating container 132 having a receiving space defined therein, a fixed electrode 134 fixedly received in a upper portion of the insulating container 132, and a fixed contact 134a disposed at an end of the fixed electrode 134, a movable electrode 136 installed in a lower portion of the insulating container 132 to be movable up and down, and a movable contact 136a disposed at an end of the movable electrode 136. A arc shield 132a that creates vacuum is housed inside the insulating container 132. The arc shield 132a wraps around the fixed electrode 134 and the fixed contact 134a, and the movable electrode 136 and the movable contact 136a. The movable contact 136a may be brought into in an inserted state in which the movable contact 136a comes into contact with the fixed contact 134a under movement of the movable electrode 136 or may be brought into a withdrawn state (blocked state) in which the movable contact 136a is spaced from the fixed contact 134a. The movable electrode 136 ascends or descends under movement of the push rod assembly 200.

The push rod assembly 200 inserts or withdraws the movable electrode 136. The push rod assembly 200 includes a movable rod 210 connected to the movable electrode 136 and a push rod 230 connected to the main shaft 300, and a rod housing 250 having a top coupled to the movable rod 210 and a bottom coupled to the push rod 230, and an inserting spring 270 which is accommodated inside the rod housing 250 and is compressed or restored by the push rod 230. The main shaft 300 is connected to the bottom of the push rod 230.

The main shaft 300 is connected to the mechanism assembly 400 and transmits the power generated from the mechanism assembly 400 to the push rod assembly 200.

Figure 2:
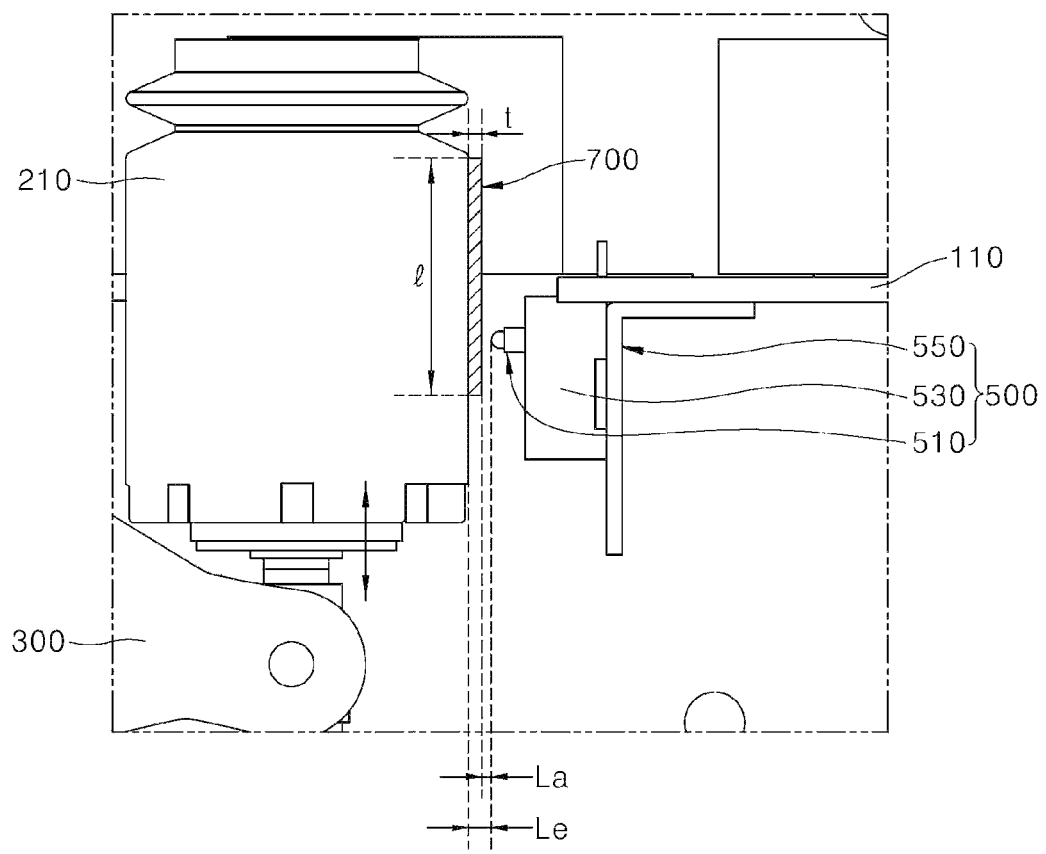
FIG. 2 is a perspective view showing an installed state to which a first example of a contact monitoring device according to the present disclosure is applied.
Figure 3:
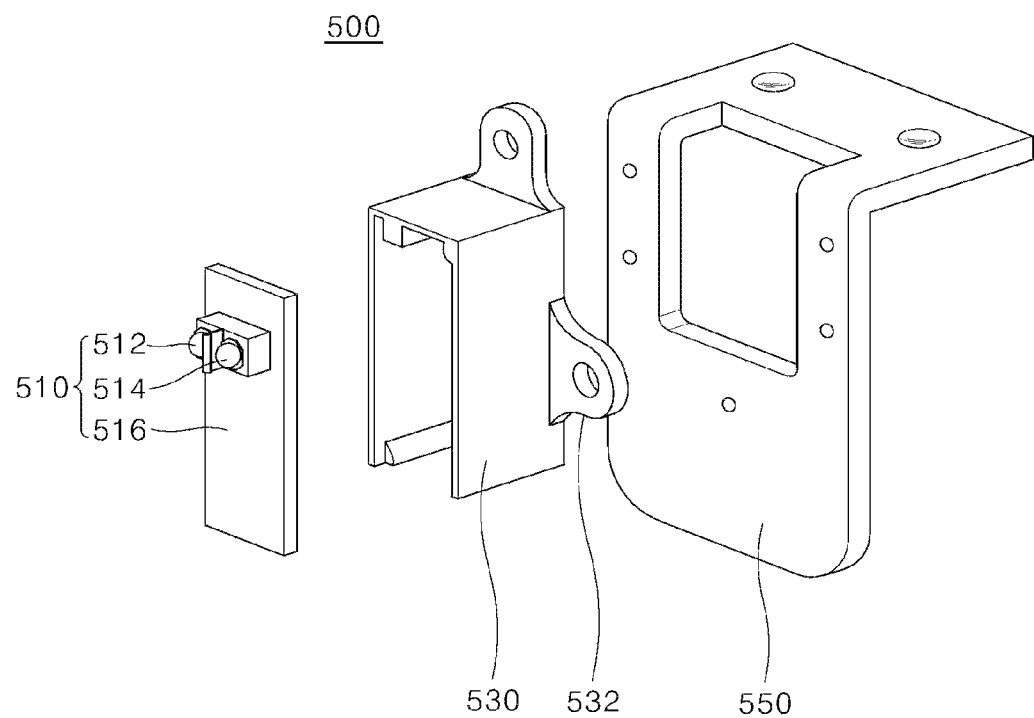
FIG. 3 is an exploded perspective view showing a photosensor module of the contact monitoring device according to FIG. 1.

FIG. 2 is a perspective view showing an installed state to which a first example of a contact monitoring device according to the present disclosure is applied. FIG. 3 is an exploded perspective view showing a photosensor module of the contact monitoring device according to FIG. 1.

As shown in FIG. 2 and FIG. 3, the contact monitoring device according to the first embodiment of the present disclosure includes a discriminative member 700 formed on an outer circumferential face of the cylindrical rod housing 210 of the push rod assembly 200, and stepped from the outer circumferential face of the rod housing 210 and a sensor assembly 500 installed adjacent to the discriminative member 700 for detecting presence or absence of a step portion between the outer circumferential face of the rod housing 210 and an outer side face of the discriminative member 700.

The sensor assembly 500 is installed on a bottom face of the main circuit 100.

The sensor assembly 500 includes a photosensor module 510 for detecting a position of the discriminative member 700, a sensor holder 530 for accommodating therein the photosensor module 510, and a sensor bracket 550 for coupling the sensor holder 530 to the bottom of the main circuit 100.

The photosensor module 510 includes a light-emitter 512 and a light-receiver 514, and a circuit 516 that processes signals from the light-emitter 512 and the light-receiver 514. The light-emitter 512 and the light-receiver 514 are installed side by side and on one face of the circuit 516.

The light-emitter 512 and the light-receiver 514 of the photosensor module 510 are oriented to face the outer circumferential surface of the rod housing 110 of the push rod assembly 200. Meaning of the orientation direction of the photosensor module 510 will be described later.

The light-emitter 512 emits light. The light-receiver 514 receives the light emitting from the light-emitter 512 and then reflected from the outer circumferential face of the rod housing 210.

The circuit 516 may calculate a distance value between the photosensor module 510 and the outer circumferential face of the rod housing 210, based on a time duration from a time at which the light emits from the light-emitter 512 to a time at which the emitting light is reflected from the outer circumferential face of the rod housing 210 and is received by the receiver 514, and preset light speed information. In another example, a photocurrent proportional to an intensity of the light detected by the light-receiver 514 flows in the circuit 516. Thus, the larger the amount of reflected and returned light, the larger the amount of the current generated. The photosensor module 510 detects the amount of the light emitting from the light-emitter 512 and then reflected from the member. Thus, as an object is farther away from the photosensor module 510, an amount of light reflected from the object and then incident to the light-receiver 514 decreases. As the amount of the incident light decreases, the photocurrent becomes weaker. Thus, a distance between the object and the photosensor module 510 is identified.

Therefore, a direction in which the photosensor module 510 emits light and then the light is reflected from the member and is incident to the module 510 refers to a sensing direction thereof. The photosensor module 510 may detect a displacement in the same direction as the sensing direction.

The circuit 516 may process the photocurrent to generate a signal and may output the signal to an external component. An intensity of the output signal decreases or increases based on the sensed light amount. The light amount varies based on the displacement. Therefore, processing the signal output from the circuit 516 may allow the displacement to be calculated. The signal output from the circuit 516 may be transmitted to an external data processing device not shown in the drawing, or to a smart terminal of an administrator not shown in the drawing or the like.

The above-described determination unit may be disposed in the circuit 516 or may be disposed in the external data processing device or the smart terminal. The determination unit may process the output signal from the circuit 516 and compare the processing result with a pre-stored reference value and thus determine the contact wear amount of the vacuum interrupter 130 based on the comparing result. Thus, the photosensor module 510 according to the present disclosure may calculate a distance value thereof to the outer circumferential face of the rod housing 210 which moves up or down.

Further, the sensor holder 530 houses the photosensor module 510. The sensor holder 530 may have a box shape with one open side face. The light-emitter 512 and the light-receiver 514 of the photosensor module 510 are exposed through one open side face of the sensor holder 530. The sensor holder 530 may have coupling means 532 in a side face opposite to the open one side face. The coupling means may be coupled to the sensor bracket 550. The coupling means 532 may be embodied as a hole into which a bolt is inserted.

The sensor holder 530 may have a frame shape such as a 'L', inversed 'L', or '⊏' shape rather than the box shape as long as the photosensor module 510 is inserted into but is not separated from the holder.

The sensor bracket 550 is mounted on a bottom of the housing 110 defining an exterior appearance of the main circuit 100. The sensor bracket 550 is not limited in a shape thereof as long as the sensor bracket may support the sensor holder 530. However, in accordance with the present disclosure, the photosensor module 510 should face toward the rod housing 210. Accordingly, the sensor bracket 550 has an inverted 'L' shape. The sensor holder 530 is coupled to a bottom face of the housing 110 of the main circuit 100. A plurality of fastening holes for fastening the sensor holder 530 to the sensor bracket 550 and a plurality of fastening holes for fastening the sensor bracket 550 to the housing 110 may be defined in a plate plane of the sensor bracket 550. The sensor bracket 550 may be coupled to the sensor holder 530 and the housing 110 via bolting or the like.

In the above-described embodiment, a case in which the sensor holder 530 and the sensor bracket 550 are separate components is described by way of example. However, when the sensor holder 530 and the sensor bracket 550 accommodate therein the photosensor module 510 and are coupled to the housing 110 of the main circuit 100, the sensor holder 530 and the sensor bracket 550 may be integrated into a single component.

Further, the photosensor module 510 according to the present disclosure may be embodied as a sensor using another measurement method that is fixed to a position adjacent to the rod housing 210 to calculate the distance value thereof to the outer circumferential face of the rod housing 210.

A first example of a discriminative member according to the present disclosure will be described.

Figure 4:
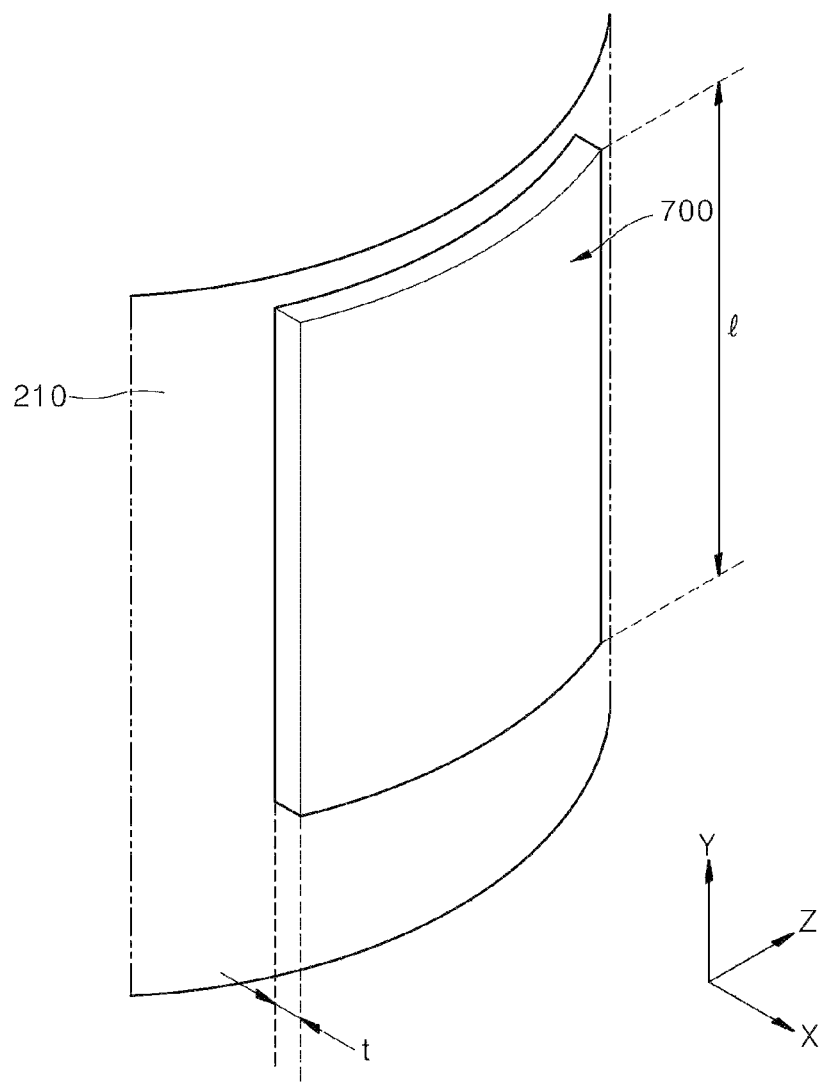
FIG. 4 is a perspective view showing a first example of a discriminative member according to the present disclosure.

FIG. 4 is a perspective view showing a first example of a discriminative member of the present disclosure.

As shown in FIG. 2, the discriminative member 700 according to the present disclosure refers to a separate member attached to or mounted on the outer circumferential face of the rod housing 210. When the member is attached thereto, the discriminative member 700 may be attached thereto via a separate adhesive. When the member is mounted thereon, the member may be detachably mounted thereon via a coupling member such as a screw bolt.

The discriminative member 400 has a thickness, a dimension in the vertical direction, and a dimension in a horizontal direction as set.

Therefore, the discriminative member 700 protrudes from the outer side face of the rod housing 210 by a certain thickness t.

The discriminative member 700 may be attached to the outer circumferential face of the cylindrical rod housing 210 via a separate adhesive. The discriminative member 400 may be made of a member having flexibility, or may be embodied as a member having a certain hardness.

As the discriminative member 700 has the thickness t, a step is formed between the outer circumferential face of the rod housing 210 and the outer side face of the discriminative member 700 and at a predetermined position.

The outer side face of the discriminative member 700 as described above is oriented to face the photosensor module 510 including the light-emitter 512 and the light-receiver 514.

In this regard, the dimension 1 in the vertical direction of the discriminative member 700 is set to correspond to a vertical displacement or an ascending or descending displacement of the rod housing 210 formed in a state in which the fixed contact 134*a* and the movable contact 136*a* respectively have preset reference vertical dimensions and contact each other.

Accordingly, when the vertical dimension of either or both of the fixed contact 134*a* and the movable contact 136*a* is reduced to a certain value due to the contact wear, a total vertical dimension thereof in the state in which the fixed contact 134*a* and the movable contact 136*a* are in contact with each other will be smaller than or equal to a sum of the above-described reference vertical dimensions. The reference vertical dimension refers to a limit value of the contact wear amount.

In this case, the rod housing 210 further moves up to a certain level to increase the vertical displacement thereof.

Accordingly, a sensed area by the photosensor module 510 may change to a level below a lower end of the discriminative member 700. The sensed area refers an area to which light emits from the emitter and from which the light is reflected.

That is, when the sensed area by the photosensor module 510 changes to the area below the lower end of the discriminative member 700, the sensed area is formed on the outer circumferential face of the rod housing 210 below the lower end of the discriminative member 700.

Figure 5:
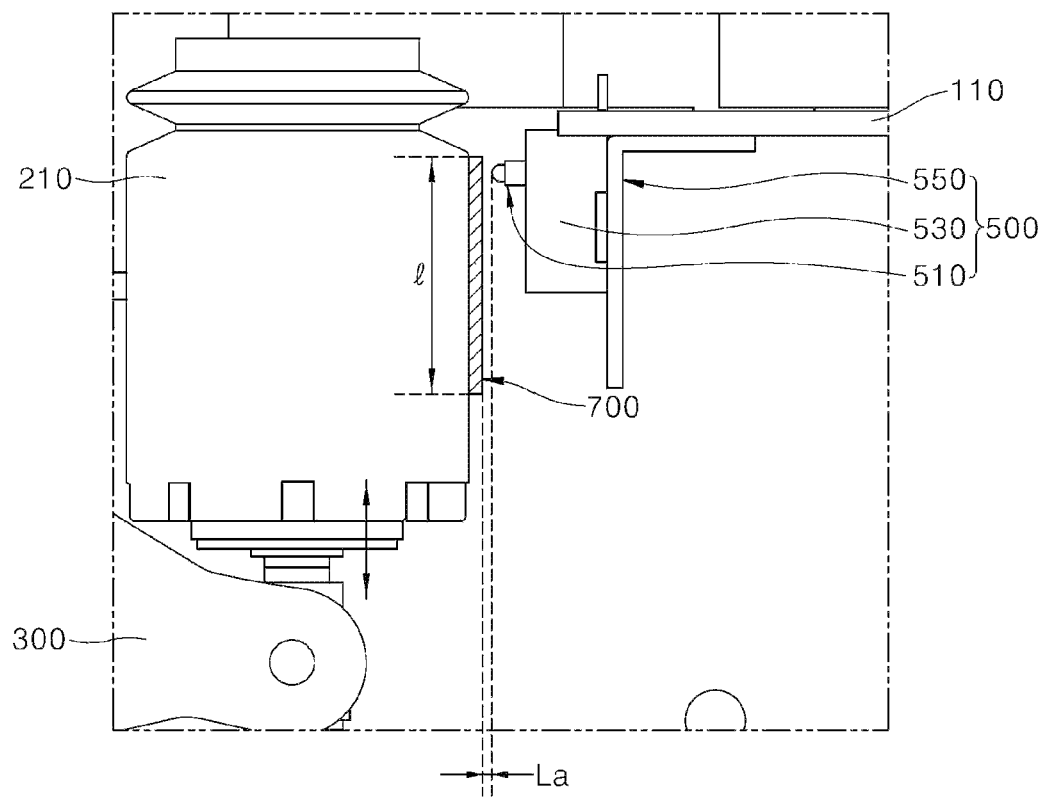
FIG. 5 is a diagram showing an example in which a sensed area is included in an outer side face of the discriminative member according to the present disclosure
Figure 6:
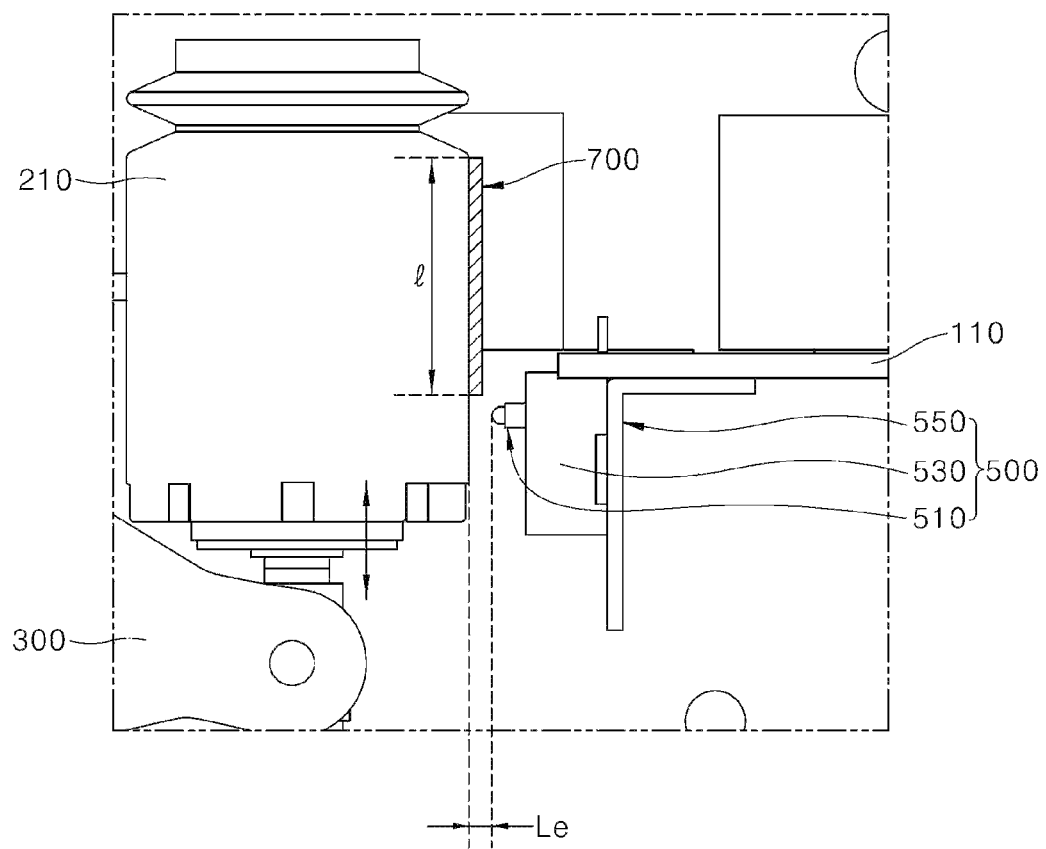
FIG. 6 is a diagram showing an example in which a sensed area is included of an outer circumferential face of a rod housing deviating from a bottom of the discriminative member.

FIG. 5 is a diagram showing an example in which the sensed area is included in an outer side face of the discriminative member according to the present disclosure. FIG. 6 is a diagram showing an example in which the sensed area is included in the outer circumferential face of the rod housing below a bottom of the discriminative member according to the present disclosure.

With reference to FIG. 5 and FIG. 6, an operation of the contact monitoring device according to the present disclosure will be described.

A detailed description of a method of detecting the contact wear amount using the photosensor module of the contact monitoring device according to the present disclosure having the above configuration is as follows.

Since the push rod assembly 200 moves in the vertical direction as shown in FIG. 5, a sensed position by the photosensor module 510 is always maintained at the same position in an open state. In an initial insertion state, the push rod assembly 200 moves by a certain amount of a vertical displacement within the vertical dimension 1 of the discriminative member 700. Then, When the contact insertion is repeated, the push rod assembly 200 rises up along the vertical direction due to the wear amount. That is, an increase in the vertical displacement of the push rod assembly 200 corresponds to the contact wear amount.

In order to measure the displacement amount of the push rod assembly 200, the vertical displacement of the push rod assembly 200 must be detected. To this end, it is preferable to install a sensor capable of detecting the vertical displacement below the push rod assembly 200. However, since the main shaft 300 is coupled to a lower end of the push rod assembly 200 and lower components of the vacuum circuit breaker A exist below the push rod assembly 200, it is difficult to secure a sufficient space to install the sensor below the push rod assembly 200.

Therefore, the photosensor module 510 according to the present disclosure is installed adjacent to the outer circumferential face of the rod housing 210 and installed at one side parallel to the vertical movement direction of the push rod assembly 200. In this regard, the sensing direction of the photosensor module 510 is perpendicular to the vertical movement direction of the push rod assembly 200. Further, in order to minimize an interference with surrounding portions, the photosensor module 510 is installed on the bottom of the housing 110 of the main circuit 100 and adjacent to the outer circumferential face of the rod housing 210.

The push rod assembly 200 only has the displacement in the vertical direction and does not move in a horizontal direction. Thus, even when the photosensor module 510 is installed on one side face of the push rod assembly 200, the vertical displacement of the push rod assembly 200 is detected by the photosensor module 510. To solve this problem, in this embodiment, the discriminative member 700 is applied to generate the same effect as converting the vertical displacement of the push rod assembly 200 into the horizontal displacement thereof. The photosensor module 510 may be used together with the discriminative member 700.

Referring to FIG. 5, the discriminative member 700 has the set length or vertical dimension. The rod housing 210 is raised up so that the fixed contact 134a and the movable contact 136a come into contact with each other.

When a sum of the vertical dimensions of both the contacts meets a set reference value in a state where the fixed contact 134a and the movable contact 136a contact each other, the rod housing 210 has a vertical displacement within the length in the vertical direction of the discriminative member 700.

At the same time, the light-emitter 512 emits light to the outer side face of the discriminative member 700, and the emitted light is reflected from the outer side face of the discriminative member 700 and is received by the light-emitter 514.

The circuit 516 calculates a first distance value La to the outer side face of the discriminative member 500 based on the light speed and the time duration from a light emission timing to a light receiving timing.

As described above, when the vertical displacement of the rod housing 210 is made within the length 1 of the discriminative member 700, the measured first distance value La is constant. In this case, a vertical dimension or thickness of each of the fixed contact 134a and the movable contact 136a meets a reference value as a normal thickness.

On the contrary, as shown in FIG. 6, when a portion of each or both of the fixed contact 134a and the movable contact 136a is damaged such that the thickness thereof is smaller than the reference thickness, that is, when the contact wear amount exceeds a threshold, the vertical displacement of the rod housing 210 increases.

Accordingly, when the fixed contact 134a and the movable contact 136a are in contact with each other, the rod housing 210 is further raised up to a certain vertical level.

At the same time, the sensed area by the sensor assembly is below the bottom of the discriminative member 700.

Therefore, the circuit 516 calculates a second distance value Le between an outer side face of the rod housing below the lower end of the discriminative member 700 and the photosensor module.

In addition, when the measured second distance value Le is greater than the first distance value La, the circuit 516 may recognize that the step is formed, and notify the server of the contact damage.

Accordingly, in the present disclosure, when the sensed area by the photosensor module 510 is located in the outer circumferential face area of the rod housing 210 below the bottom of the discriminative member 700, it is determined that the contact wear amount exceeds the limit.

In one example, in this embodiment, when the sum of the thicknesses of the fixed and movable in a contact state with each other is the reference thickness or in a range of the reference thickness range as described above, the vertical displacement of the rod housing is made within the length range of the discriminative member. Accordingly, the sensor module receives the light reflected from the outer side face of the discriminative member and calculate a first light amount based on the received light.

On the contrary, as the wear amount gradually reaches the limit due to repeated contact insertion, the vertical displacement of the rod housing increases.

Accordingly, the sensor module receives the light reflected from the outer circumferential face of the rod housing which is stepped and below the lower end of the discriminative member, and calculates a second light amount based on the received light.

The first and second light amounts measured as described above have different values due to different reflectivity.

Accordingly, the circuit may recognize the step below the lower end of the discriminative member as the first light amount is measured as the second light amount.

Further, the circuit may identify whether the contact wear amount has reached the preset limit based on an analyzing result of a signal output from the photosensor module 510.

The photosensor module 510 may not directly detect the displacement in the vertical direction that is perpendicular to the sensing direction, but may convert the vertical displacement to the horizontal displacement based on the distance measurement to the outer side face of the discriminative member 700 or the outer circumferential face of the rod housing 210. Therefore, the photosensor module 510 may indirectly monitor and detect the contact wear amount.

The contact wear amount monitored by the photosensor module 510 may be monitored in real time or at a preset time period. Accordingly, since the contact wear amount may be determined before the contact wear amount exceeds the threshold, an appropriate maintenance timing may be known. Further, the device may improve the reliability and performance of the vacuum circuit breaker.

Figure 7:
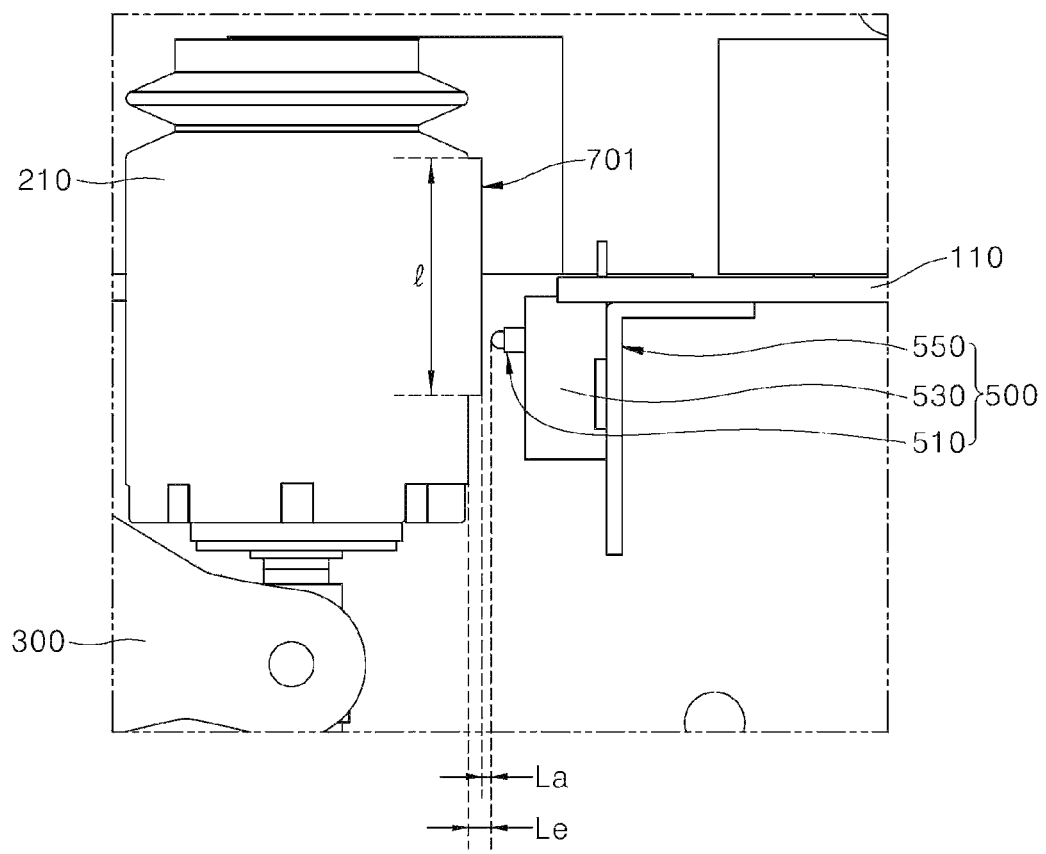
FIG. 7 is a diagram showing a second example of a discriminative member according to the present disclosure.

FIG. 7 is a diagram showing a second example of a discriminative member according to the present disclosure.

Referring to FIG. 7, a discriminative member 701 according to the present disclosure protrudes from the outer circumferential face of the rod housing 210, and may be formed to be integral with the rod housing 210.

The discriminative member 701 may be a portion of the rod housing 210. The lower end of the discriminative member 701 constitutes a step relative to the outer circumferential face of the rod housing 210.

The discriminative member 701 may face the light-emitter 512 and the light-receiver 514 so as to be included in the sensed area by the photosensor module 510.

Accordingly, a first distance value La from the photosensor module 510 to the outer side face of the discriminative member 701 and a second distance value Le from photosensor module 510 to the outer circumferential face of the rod housing 210 below the member 701 are different from each other. Since the discriminative member 700 is formed to protrude from the outer circumferential face of the rod housing 210, the second distance value Le is greater than the first distance value La.

Therefore, the photosensor module 510 may determine whether the step is formed based on the difference in the measured distance values.

Since the dimensions in the horizontal and vertical dimensions, and the thickness of the discriminative member 701 may be the same as those of the first example described above, the description thereof will be omitted.

However, a length 1 in the vertical direction of the discriminative member 701 may vary based on a setting of the limit value of the contact wear amount.

Figure 8:
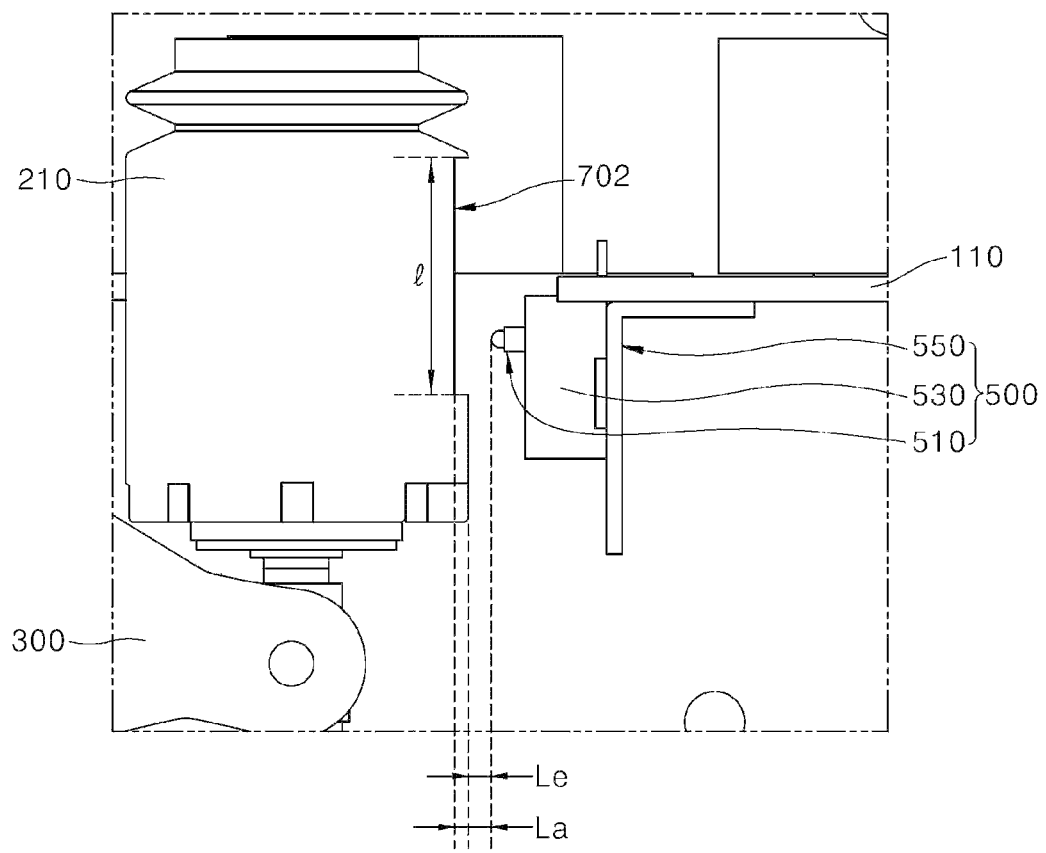
FIG. 8 is a diagram showing a third example of a discriminative member according to the present disclosure.

FIG. 8 is a diagram showing a third example of a discriminative member according to the present disclosure.

Referring to FIG. 8, a discriminative member 702 according to the present disclosure is embodied as a groove having a predetermined depth from the outer circumferential face of the rod housing 210, and may be formed to be integral with the rod housing 210.

The discriminative member 702 may be a portion of the rod housing 210. The lower end of the discriminative member 702 constitute a step relative to the outer circumferential face of the rod housing 210.

The discriminative member 702 may be oriented to face the light-emitter 512 and the light-receiver 514 so as to be included in the sensed area by the photosensor module 510.

Accordingly, a first distance value La from the photosensor module 510 to an inner face of the groove of the discriminative member 702 having the groove shape are different from a second distance value Le from the photosensor module 510 to the outer face of the rod housing. Since the discriminative member 702 is formed in the groove shape having a predetermined depth from the outer circumferential face of the rod housing 210, the second distance value Le is smaller than the first distance value La.

Therefore, the photosensor module 510 may determine whether the step is formed based on the difference in the measured distance values.

Since the dimensions in the horizontal and vertical dimensions, and the thickness of the discriminative member 702 may be the same as those of the first and second examples as described above, the description thereof will be omitted.

In this regard, a length 1 in the vertical direction of the discriminative member 702 as the groove may vary based on a setting of the limit value of the contact wear amount.

In the above-mentioned examples, a case that the photosensor module is installed at the same vertical level as that of the rod housing of the push rod assembly has been described by way of example. However, the photosensor module may be installed below the push rod assembly if interference thereof with surrounding portions may be avoided. In this case, since the sensing direction by the photosensor module and the movement direction of the push rod assembly are the same, the contact wear amount as the movement displacement in the vertical direction may be directly detected using the photosensor without the discriminative member.

Next, a third example of a discriminative member according to the present disclosure will be described.

Figure 9:
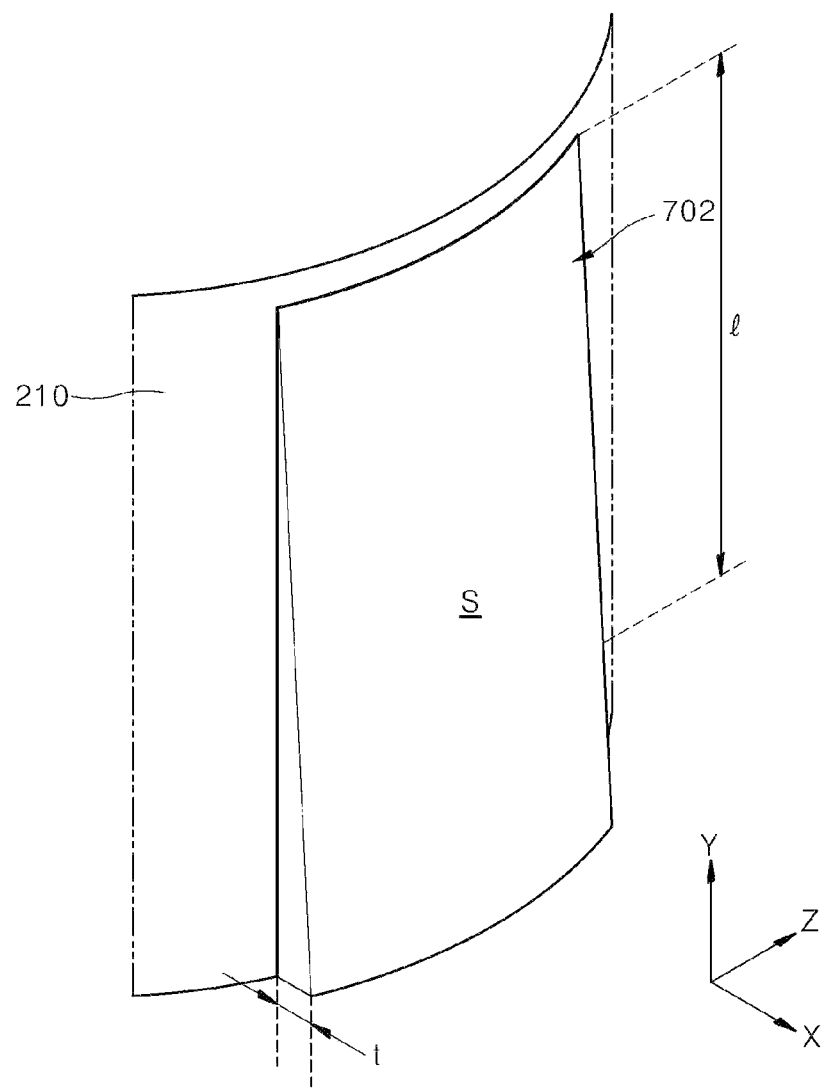
FIG. 9 is a perspective view showing a third example of a discriminative member of the present disclosure.

FIG. 9 is a perspective view showing a third example of a discriminative member of the present disclosure.

As shown in FIG. 9, the discriminative member 702 according to the present disclosure is embodied as a separate member on the outer circumferential face of the rod housing 210 and is attached or installed thereto or thereon. The discriminative member 702 may be attached thereto via a separate adhesive. The member 702 may be detachably installed thereon via a coupling member such as a screw bolt.

The discriminative member 702 has a thickness, and dimensions in the vertical and horizontal directions as set.

Accordingly, the discriminative member 702 has an inclined face S having an inclination angle as a thickness t thereof gradually increases as the member extends from a top to a bottom of the outer circumferential face of the rod housing 210.

Accordingly, the inclined face S of the discriminative member 702 according to the present disclosure has a shape that gradually protrudes laterally as the member 702 extends from the top to the bottom thereof.

The discriminative member 702 may be attached to the outer circumferential face of the cylindrical rod housing 210 via a separate adhesive. The discriminative member 702 may be made of a material having flexibility, and may be embodied as a member having a certain hardness.

The inclined face S of the discriminative member 702 having the above shape is oriented to face the photosensor module 510 including the light-emitter 512 and light-receiver 514.

In this regard, a distance value between the inclined face of the discriminative member and the photosensor module is gradually increased as the member 702 extends from the top to the bottom of the inclined face.

A limit position may be set to a predetermined position along a vertical direction of the inclined face of the discriminative member. That is, a normal zone from the upper end of the inclined face to the limit position may correspond to the vertical displacement or the ascending or descending displacement of the rod housing 210 occurring in a state in which each of the fixed contact 134a and the movable contact 136a has a preset reference thickness while the two contacts are in contact with each other.

An abnormal zone from the limit position to a lower end of the inclined face may correspond to the vertical displacement or the ascending or descending displacement of the rod housing 210 occurring in a state in which the thickness of each of the fixed contact 134a and the movable contact 136a is smaller than the reference thickness while the two contacts are in contact with each other.

Accordingly, when the thickness of either or both of the fixed contact 134a and the movable contact 136a is smaller than a certain thickness due to the contact wear, a sum of the thicknesses of the fixed contact 134a and the movable contact 136a in the state in which the fixed contact 134a and the movable contact 136a are in contact with each other may be smaller than or equal to the above-described reference thickness. The reference thickness may act as the limit value of the contact wear amount.

In this case, the rod housing 210 is further raised up to a certain level to increase the vertical displacement.

Accordingly, the sensed area by the photosensor module 510 may reach the above abnormal zone of the inclined face S of the discriminative member 700 including the limit position. The sensed area refers to an area to which light emits and from which the light is reflected.

That is, the sensed area by the photosensor module 510 is disposed in the abnormal zone. In this regard, the sensed area is disposed in the outer circumferential face of the rod housing 210 as the lower outer area of the discriminative member 700.

Figure 10:
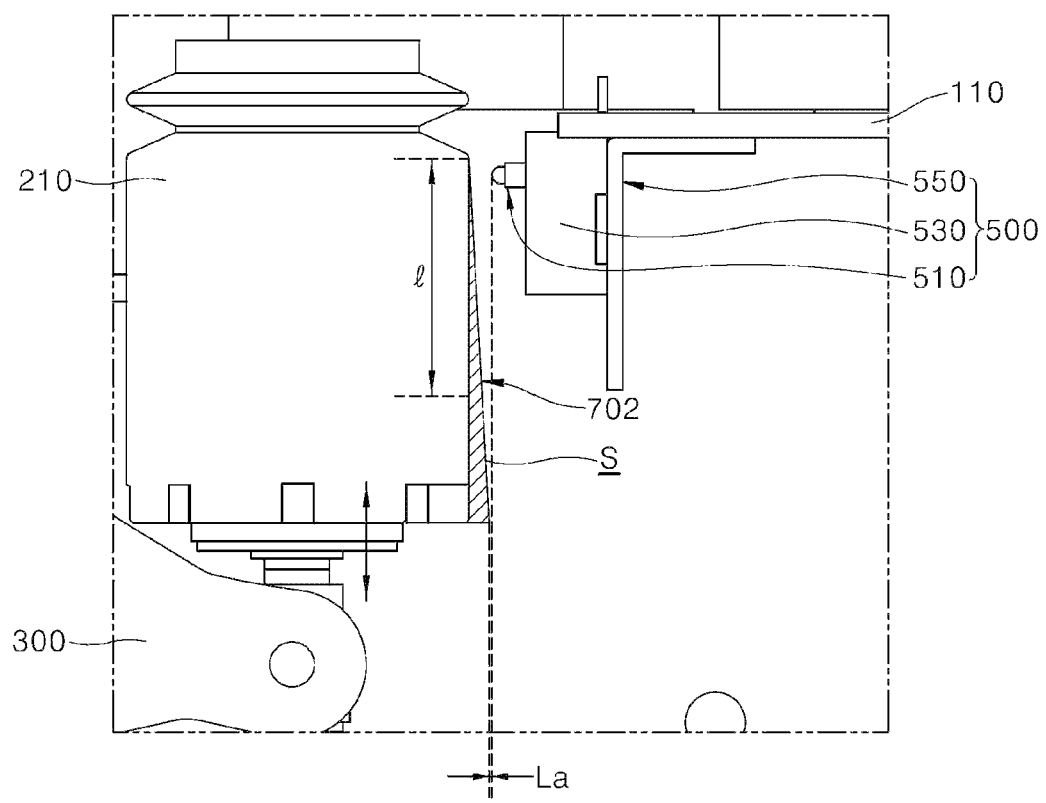
FIG. 10 is a diagram showing an example in which a sensed area is included in a normal zone of an inclined face of a discriminative member according to the present disclosure.
Figure 11:
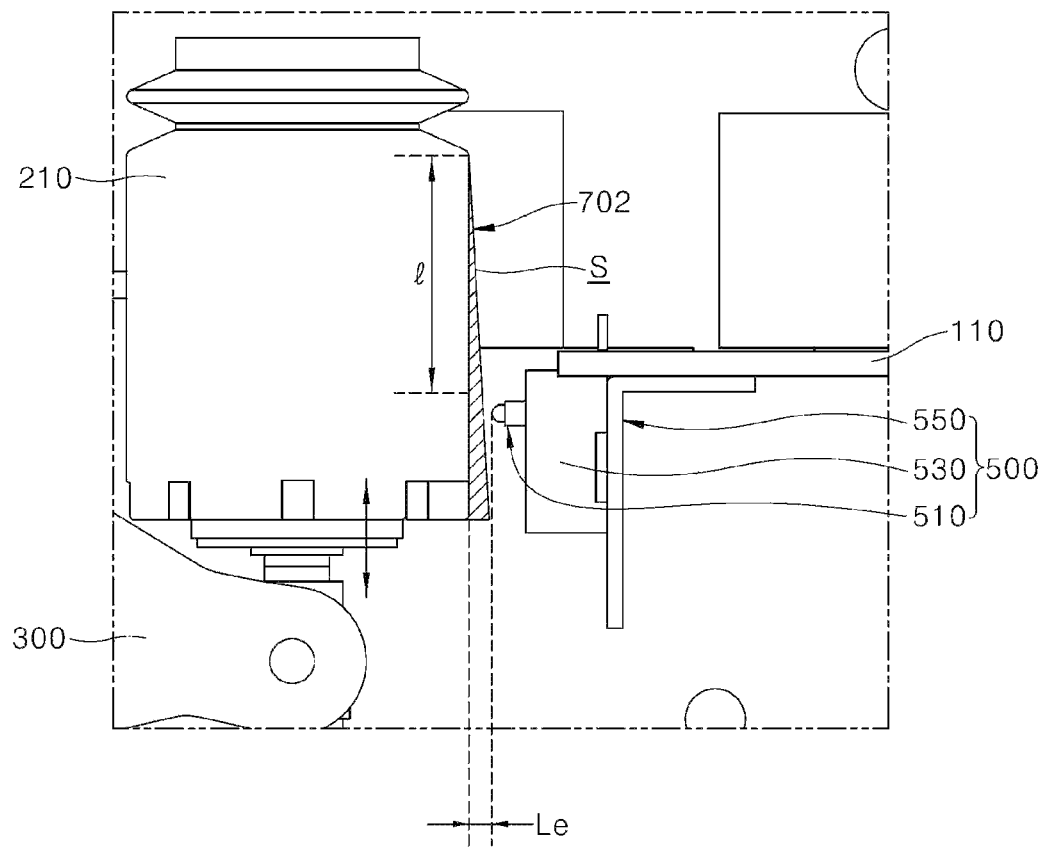
FIG. 11 is a diagram showing an example in which a sensed area is included in an abnormal zone of the inclined face of the discriminative member according to the present disclosure.

FIG. 10 is a diagram showing an example in which the sensed area is included in the normal zone of the inclined face of the discriminative member according to the present disclosure. FIG. 11 is a diagram showing an example in which the sensed area is included in the abnormal zone of the inclined face of the discriminative member according to the present disclosure.

With reference to FIG. 10 and FIG. 11, an operation of the contact monitoring device according to the present disclosure will be described.

A detailed description of the method of detecting the contact wear amount using the photosensor module of the contact monitoring device of the present disclosure having the above configuration is as follows.

Since the push rod assembly 200 moves in the vertical direction as shown in FIG. 10, the sensed position by the photosensor module 510 is always maintained at the same position in the open state. In the initial inserted state, the push rod assembly 200 may have a certain amount of a vertical displacement within the length 1 of the discriminative member 702. When the contact is repeatedly inserted, the push rod assembly 200 rises up along the vertical direction by the wear amount. That is, the increase in the vertical displacement of the push rod assembly 200 corresponds to the increase in the contact wear amount.

In order to measure the displacement amount of the push rod assembly 200, the vertical displacement of the push rod assembly 200 must be detected. To this end, it is preferable to install a sensor capable of detecting the vertical displacement below the push rod assembly 200. However, since the main shaft 300 is coupled to a lower end of the push rod assembly 200 and lower components of the vacuum circuit breaker A exist below the push rod assembly 200, it is difficult to secure a sufficient space to install the sensor below the push rod assembly 200.

Therefore, the photosensor module 510 according to the present disclosure is installed adjacent to the outer circumferential face of the rod housing 210 and installed at one side parallel to the vertical movement direction of the push rod assembly 200. In this connection, the sensing direction of the photosensor module 510 is perpendicular to the vertical movement direction of the push rod assembly 200. Further, in order to minimize an interference with surrounding portions, the photosensor module 510 is installed on the bottom of the housing 110 of the main circuit 100 and adjacent to the outer circumferential face of the rod housing 210.

The push rod assembly 200 only has the displacement in the vertical direction and does not move in a horizontal direction. Thus, even when the photosensor module 510 is installed on one side face of the push rod assembly 200, the vertical displacement of the push rod assembly 200 is not detected by the photosensor module 510. To solve this problem, in this embodiment, the discriminative member 702 is applied to generate the same effect as converting the vertical displacement of the push rod assembly 200 into the horizontal displacement thereof. The photosensor module 510 may be used together with the discriminative member 700.

Referring to FIG. 10, the discriminative member 702 has a set length and has the inclined face S that gradually protrudes outwardly as it extends from the top to the bottom.

Then, the rod housing 210 is raised up so that the fixed contact 134a and the movable contact 136a come into contact with each other.

When the sum of the thicknesses of the two contacts meets the set reference thickness in the state where the fixed contact 134a and the movable contact 136a are in contact with each other, the rod housing 210 has a vertical displacement within the above-described normal zone of the inclined face S of the discriminative member 700.

At the same time, the light-emitter 512 emits light to the inclined face S of the discriminative member 702, and the emitted light is reflected from the outer side face of the discriminative member 700 and is received by the light-emitter 514.

The circuit 516 calculates a first distance value La up to the normal zone of the inclined face S of the discriminative member 500 based on the light speed and the time duration from the light emission time to the light reception time.

The calculated first distance value gradually increases as the member 702 extends from the top to the bottom of the inclined face S in the normal zone thereof.

In this case, the thickness of each of the fixed contact 134a and the movable contact 136a has a reference thickness and has a normal thickness.

In this connection, a reference distance value a sa distance value from the circuit to the limit position set in the inclined face S is set in the circuit 516, Accordingly, when the distance value to the inclined face S as measured is greater than or equal to the reference distance value, the sensed area is included in the normal zone. When the distance value to the inclined face S as measured is smaller than the reference distance value, the sensed area is included in the abnormal zone.

On the contrary, as shown in FIG. 11, when a portion of each or both of the fixed contact 134a and the movable contact 136a is damaged such that the thickness thereof is smaller than the reference thickness, that is, when the contact wear amount exceeds a threshold, the vertical displacement of the rod housing 210 increases.

Accordingly, when the fixed contact 134a and the movable contact 136a are in contact with each other, the rod housing 210 is further raised up to a certain vertical level.

At the same time, the sensed area is included in the abnormal zone of the inclined face S of the discriminative member 702.

Accordingly, the circuit 516 calculates a second distance value Le up to a portion of the inclined face S which is included in the above-described abnormal zone.

In addition, when the measured second distance value Le is greater than a reference distance value, the circuit 516 may notify the server of the contact damage.

Accordingly, in accordance with the present disclosure, when the sensed area by the photosensor module 510 reaches the abnormal zone out of the limit position of the inclined face S of the discriminative member 702, it is determined that the contact wear amount has reached or exceeded the limit value.

In one example, in this embodiment, when the sum of the thicknesses of the fixed and movable in a contact state with each other is the reference thickness or in a range of the reference thickness range as described above, the vertical displacement of the rod housing is made within the length range of the discriminative member. Accordingly, the sensor module receives the light reflected from the outer side face of the discriminative member and calculate a first light amount based on the received light.

On the contrary, as the wear amount gradually reaches the limit due to repeated contact insertion, the vertical displacement of the rod housing increases.

Accordingly, the sensor module receives the light reflected from a portion of outer circumferential face of the rod housing which is stepped and below the lower end of the discriminative member, and calculates a second light amount based on the received light.

The first and second light amounts measured as described above have different values due to different reflectivity.

Accordingly, the circuit may recognize the step below the lower end of the discriminative member as the first light amount is measured as the second light amount.

Further, the circuit may identify whether the contact wear amount has reached the preset limit based on an analyzing result of a signal output from the photosensor module 510.

The photosensor module 510 may not directly detect the displacement in the vertical direction that is perpendicular to the sensing direction, but may convert the vertical displacement to the horizontal displacement based on the distance measurement to the inclined face S of the discriminative member 702. Therefore, the photosensor module 510 may indirectly monitor and detect the contact wear amount.

The contact wear amount monitored by the photosensor module 510 may be monitored in real time or at a preset time period. Accordingly, since the contact wear amount may be determined before the contact wear amount exceeds the threshold, an appropriate maintenance timing may be known. Further, the device may improve the reliability and performance of the vacuum circuit breaker.

Figure 12:
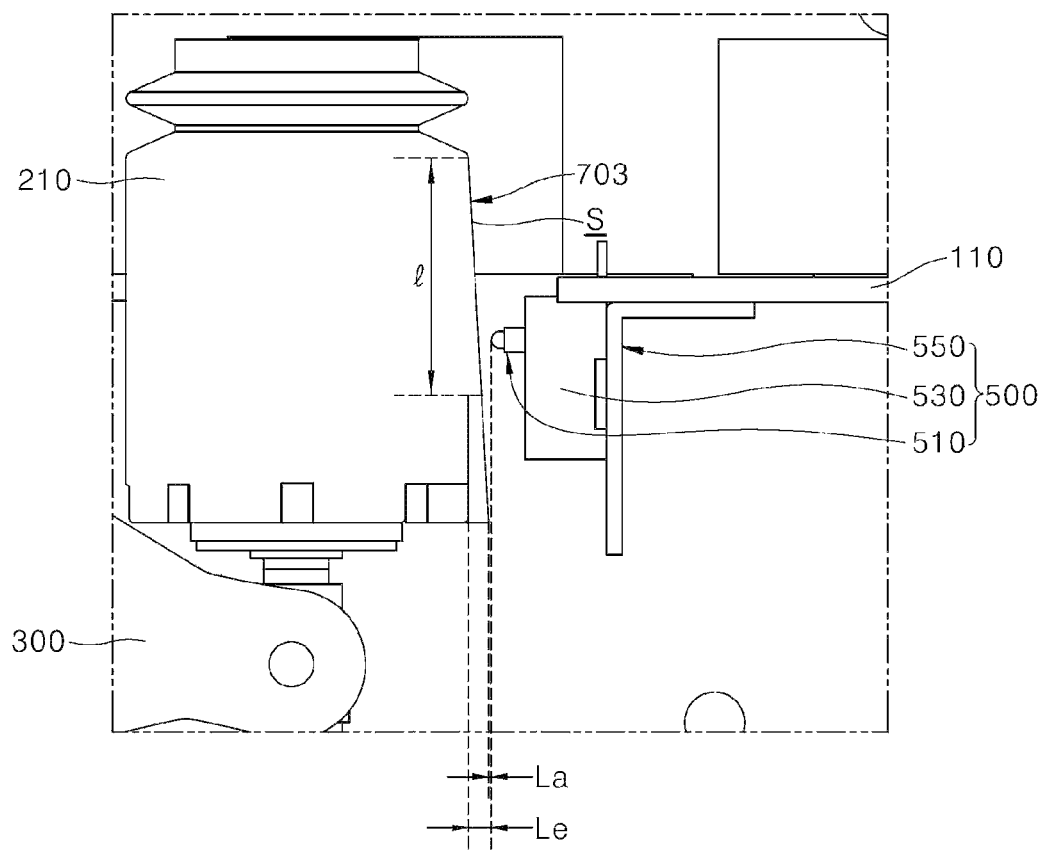
FIG. 12 is a diagram showing a fourth example of a discriminative member according to the present disclosure.

FIG. 12 is a diagram showing a fourth example of a discriminative member according to the present disclosure.

Referring to FIG. 12, a discriminative member 703 according to the present disclosure protrudes from the outer circumferential face of the rod housing 210, and may be formed to be integral with the rod housing 210.

The discriminative member 701 may be a portion of the rod housing 210. The discriminative member 703 has an inclined face S protruding outwards. The inclined face S has an inclination angle formed as the thickness t of the discriminative member 703 is gradually increased as the member extends from the top to the bottom.

The inclined face S of the discriminative member 703 is oriented to face the light-emitter 512 and the light-receiver 514 so as to be included in the sensed area by the photosensor module 510.

Accordingly, the distance value from the photosensor module 510 to the inclined face S of the discriminative member 703 is gradually decreased as the member 703 extends in a downward direction. That is, since the inclined face of the discriminative member 703 is formed in a shape that gradually protrudes outwardly as the member 703 extends from the top to the bottom of the rod housing 210, the measured distance value from the module 510 to the inclined face is decreased.

Therefore, the photosensor module 510 may determine that the contact wear amount exceeds the limit value when the measured distance value is smaller than or equal to a set reference distance value.

Since the dimensions in the vertical and horizontal directions, and the thickness of the discriminative member 703 may be the same as those of in the first example described above, a description thereof will be omitted.

However, the limit position of the inclined face S of the discriminative member 703 may be variably set in the circuit 516, based on the limit value setting of the contact wear amount.

Figure 13:
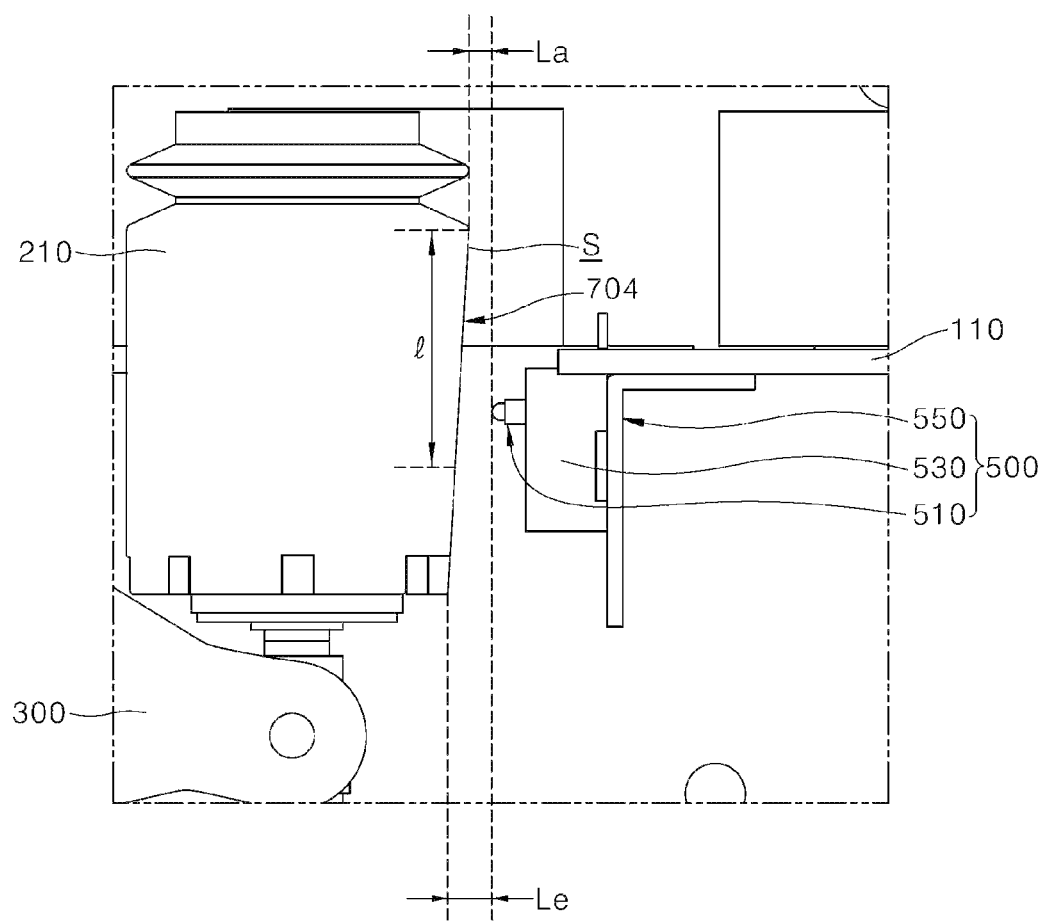
FIG. 13 is a diagram showing a fifth example of a discriminative member according to the present disclosure.

FIG. 13 is a diagram showing a fifth example of a discriminative member according to the present disclosure.

Referring to FIG. 13, a discriminative member 704 according to the present disclosure is formed as a groove gradually increasing in a depth thereof on the outer circumferential face of the rod housing 210 as the member 704 extends from the top to the bottom thereof. The discriminative member 704 formed as the groove has an inclined face S having a horizontal dimension increasing as the member 704 extends downwardly.

The discriminative member 704 is oriented to face the light-emitter 512 and the light-receiver 514 so as to be included in the sensed area by the photosensor module 510.

The inclined face S of the discriminative member 704 is oriented to face the light-emitter 512 and light-receiver 514 so as to be included in the sensed area by the photosensor module 510.

Accordingly, a distance value from the photosensor module 510 to the inclined face S of the discriminative member 704 is gradually increased as the member 704 extends in the downward direction. That is, since the inclined face S of the discriminative member 704 is formed in a groove shape having an inclined face S that has the gradually increasing horizontal dimension from the outer circumferential face of the rod housing 210 as the member 704 extends from the top to the bottom thereof, the measured distance value from the module 510 to the inclined face S increases.

Accordingly, the photosensor module 510 may determine that the contact wear amount is greater than or equal to the threshold when the measured distance value is greater than or equal to the set reference distance value.

Since the width and the length, and the thickness of the discriminative member 704 may be the same as those in the above-described first example, a description thereof will be omitted.

However, the limit position of the inclined face S of the discriminative member 703 may be variably set in the circuit 516, based on the limit value setting of the contact wear amount.

In the above-mentioned examples, a case that the photosensor module is installed at the same vertical level as that of the rod housing of the push rod assembly has been described by way of example. However, the photosensor module may be installed below the push rod assembly if interference thereof with surrounding portions may be avoided. In this case, since the sensing direction by the photosensor module and the movement direction of the push rod assembly are the same, the contact wear amount as the movement displacement in the vertical direction may be directly detected using the photosensor without the discriminative member.

The present disclosure as described above may be subjected to various substitutions, modifications and changes within the scope that does not depart from the technical spirit of the present disclosure by those of ordinary skill in the technical field to which the present disclosure belongs. Thus, the present disclosure is not limited to the above-described embodiments and the attached drawings.

What is claimed is:

1. A contact monitoring device for a vacuum circuit breaker, wherein the vacuum circuit breaker includes:
    a vacuum interrupter having:
        a fixed electrode fixed in an insulating container and having a fixed contact at one end thereof; and
        a movable electrode installed in the insulating container so as to be able to move up and down, wherein the movable electrode has a movable contact at one end thereof,
    wherein the movable contact comes into contact with or is separated from the fixed contact as the movable contact moves up and down; and
    a push rod assembly coupled to the other end of the movable electrode to move up and down the movable electrode,
    wherein the contact monitoring device includes:
        a discriminative member formed on an outer circumferential face of a rod housing of the push rod assembly, wherein the discriminative member is stepped relative to the outer circumferential face of the rod housing; and
        a sensor assembly installed adjacent to the discriminative member, wherein the sensor assembly is configured to detect presence or absence of a step between the outer circumferential face of the rod housing and an outer side face of the discriminative member.

2. The contact monitoring device of claim 1, wherein the discriminative member is attached to the outer circumferential face of the rod housing,
    wherein the discriminative member has a preset thickness, and includes a preset length and a preset width, wherein the length extends along an axis along which the movable electrode moves up and down.

3. The contact monitoring device of claim 2, wherein the length is set to correspond to a vertical displacement of the rod housing occurring in a state in which each of the movable and fixed contacts has a preset reference thickness while the movable and fixed contacts contact each other.

4. The contact monitoring device of claim 1, wherein the discriminative member is formed to protrude outwardly and is formed integrally with the rod housing,
    wherein the discriminative member has a preset thickness, and includes a preset length and a preset width, wherein the length extends along an axis along which the movable electrode moves up and down.

5. The contact monitoring device of claim 1, wherein the discriminative member is embodied as a groove having a preset horizontal dimension from the outer circumferential face of the rod housing,
    wherein the groove has a preset length and a preset width, wherein the length extends along an axis along which the movable electrode moves up and down.

6. The contact monitoring device of claim 1, wherein the sensor assembly includes a photosensor module configured to determine the presence or absence of the step, based on whether a difference between a distance value from the photosensor module to the outer side face of the discriminative member and a distance value from the photosensor module to the outer circumferential face of the rod housing is equal to or greater than a predefined amount.

7. The contact monitoring device of claim 6, wherein the device further comprises:
    a sensor holder for receiving and supporting the photosensor module; and
    a sensor bracket for coupling the sensor holder to a housing for accommodating therein the vacuum interrupter.

8. A vacuum circuit breaker comprising:
    a vacuum interrupter having:
        a fixed electrode fixed in an insulating container and having a fixed contact at one end thereof; and
        a movable electrode installed in the insulating container so as to be able to move up and down, wherein the movable electrode has a movable contact at one end thereof,
    wherein the movable contact comes into contact with or is separated from the fixed contact as the movable contact moves up and down;
    a main circuit having a housing accommodating therein the vacuum interrupter;
    a push rod assembly coupled to the other end of the movable electrode to move up and down the movable electrode; and
    a discriminative member formed on an outer circumferential face of a cylindrical rod housing of the push rod assembly, the discriminative member being stepped relative to the outer circumferential face of the rod housing; and
    a sensor assembly installed adjacent to the discriminative member, wherein the sensor assembly is configured to determine absence or presence of the step, based on whether a difference between a distance value from the sensor assembly to an outer side face of the discriminative member and a distance value from the sensor assembly to the outer circumferential face of the rod housing is equal to or greater than a predefined amount.

9. The vacuum circuit breaker of claim 8, wherein the discriminative member is attached to the outer circumferential face of the rod housing,
    wherein the discriminative member has a preset thickness, and includes a preset length and a preset width, wherein the length extends along an axis along which the movable electrode moves up and down.

10. The vacuum circuit breaker of claim 9, wherein the length is set to correspond to a vertical displacement of the rod housing occurring in a state in which each of the movable and fixed contacts has a preset reference thickness while the movable and fixed contacts contact each other.

11. The vacuum circuit breaker of claim 8, wherein the discriminative member is formed to protrude outwardly and is formed integrally with the rod housing,
    wherein the discriminative member has a preset thickness, and includes a preset length and a preset width, wherein the length extends along an axis along which the movable electrode moves up and down.

12. The vacuum circuit breaker of claim 8, wherein the discriminative member is embodied as a groove having a preset horizontal dimension from the outer circumferential face of the rod housing,
    wherein the groove has a preset length and a preset width, wherein the length extends along an axis along which the movable electrode moves up and down.

13. A contact monitoring device for a vacuum circuit breaker, wherein the vacuum circuit breaker includes:
- a vacuum interrupter having:
    - a fixed electrode fixed in an insulating container and having a fixed contact at one end thereof; and
    - a movable electrode installed in the insulating container so as to be able to move up and down, wherein the movable electrode has a movable contact at one end thereof,
    - wherein the movable contact comes into contact with or is separated from the fixed contact as the movable contact moves up and down; and
- a push rod assembly coupled to the other end of the movable electrode to move up and down the movable electrode,
- wherein the contact monitoring device includes:
    - a discriminative member formed on an outer circumferential face of a rod housing of the push rod assembly, wherein the discriminative member has an outer inclined side face inclined at an inclination angle in a direction from a top to a bottom of the rod housing; and
    - a sensor assembly installed adjacent to the discriminative member and measuring a distance value from the sensor assembly to the outer inclined side face.

14. The contact monitoring device of claim 13, wherein the discriminative member is attached to the outer circumferential face of the rod housing, wherein the discriminative member has a horizontal dimension gradually increasing as the inclined face extends from the top to the bottom of the rod housing,
- wherein the discriminative member has a preset length and a preset width, wherein the length extends along an axis along which the movable electrode moves up and down.

15. The contact monitoring device of claim 14, wherein the length is set to correspond to a vertical displacement of the rod housing occurring in a state in which each of the movable and fixed contacts has a preset reference thickness while the movable and fixed contacts contact each other.

16. The contact monitoring device of claim 13, wherein the discriminative member is formed to protrude outwardly and is formed integrally with the rod housing,
- wherein the discriminative member has a horizontal dimension gradually increasing as the inclined face extends from the top to the bottom of the rod housing,
- wherein the discriminative member has a preset length and a preset width, wherein the length extends along an axis along which the movable electrode moves up and down.

17. The contact monitoring device of claim 13, wherein the discriminative member is embodied as a groove having a horizontal dimension from the outer circumferential face of the rod housing gradually increasing as the inclined face extends from the top to the bottom of the rod housing,
- wherein the groove has a preset length and a preset width, wherein the length extends along an axis along which the movable electrode moves up and down.

18. The contact monitoring device of claim 13, wherein the sensor assembly includes a photosensor module configured to determine whether a distance value from the photosensor module to the inclined face is out of a preset reference distance value.

19. The contact monitoring device of claim 18, wherein the device further comprises a sensor holder for receiving and supporting the photosensor module, and a sensor bracket for coupling the sensor holder to a housing for accommodating the vacuum interrupter therein.

20. A vacuum circuit breaker comprising:
- a vacuum interrupter having:
    - a fixed electrode fixed in an insulating container and having a fixed contact at one end thereof; and
    - a movable electrode installed in the insulating container so as to be able to move up and down, wherein the movable electrode has a movable contact at one end thereof,
    - wherein the movable contact comes into contact with or is separated from the fixed contact as the movable contact moves up and down;
- a main circuit having a housing accommodating therein the vacuum interrupter;
- a push rod assembly coupled to the other end of the movable electrode to move up and down the movable electrode;
- a discriminative member formed on an outer circumferential face of a rod housing of the push rod assembly, wherein the discriminative member has an outer inclined side face inclined at an inclination angle in a direction from a top to a bottom of the rod housing; and
- a sensor assembly installed adjacent to the discriminative member and including a photosensor module for determining whether a distance value from the photosensor module to the outer inclined side face is out of a preset reference distance value.

21. The vacuum circuit breaker of claim 20, wherein the discriminative member is attached to the outer circumferential face of the rod housing, wherein the discriminative member has a horizontal dimension gradually increasing as the inclined face extends from the top to the bottom of the rod housing,
- wherein the discriminative member has a preset length and a preset width, wherein the length extends along an axis along which the movable electrode moves up and down.

22. The vacuum circuit breaker of claim 21, wherein the length is set to correspond to a vertical displacement of the rod housing occurring in a state in which each of the movable and fixed contacts has a preset reference thickness while the movable and fixed contacts contact each other.

23. The vacuum circuit breaker of claim 20, wherein the discriminative member is formed to protrude outwardly and is formed integrally with the rod housing,
- wherein the discriminative member has a horizontal dimension gradually increasing as the inclined face extends from the top to the bottom of the rod housing,
- wherein the discriminative member has a preset length and a preset width, wherein the length extends along an axis along which the movable electrode moves up and down.

24. The vacuum circuit breaker of claim 20, wherein the discriminative member is embodied as a groove having a horizontal dimension from the outer circumferential face of the rod housing gradually increasing as the inclined face extends from the top to the bottom of the rod housing,
- wherein the groove has a preset length and a preset width, wherein the length extends along an axis along which the movable electrode moves up and down.

* * * * *